US009121909B2

(12) United States Patent
Liu et al.

(10) Patent No.: US 9,121,909 B2
(45) Date of Patent: Sep. 1, 2015

(54) METHOD FOR ESTIMATING STATE-OF-CHARGE OF LITHIUM ION BATTERY

(75) Inventors: Fei Liu, Guangdong (CN); Xusong Ruan, Guangdong (CN); Feng Wen, Guangdong (CN)

(73) Assignee: HUIZHOU EPOWER ELECTRONICS CO., LTD., Huizhou, Guangdong (CN)

( * ) Notice: Subject to any disclaimer, the term of this patent is extended or adjusted under 35 U.S.C. 154(b) by 461 days.

(21) Appl. No.: 13/695,414

(22) PCT Filed: Mar. 14, 2011

(86) PCT No.: PCT/CN2011/071765
§ 371 (c)(1),
(2), (4) Date: Oct. 30, 2012

(87) PCT Pub. No.: WO2012/083610
PCT Pub. Date: Jun. 28, 2012

(65) Prior Publication Data
US 2013/0043876 A1 Feb. 21, 2013

(30) Foreign Application Priority Data
Dec. 24, 2010 (CN) .......................... 2010 1 0604539

(51) Int. Cl.
*G01N 27/416* (2006.01)
*G01R 31/36* (2006.01)
(52) U.S. Cl.
CPC .......... *G01R 31/361* (2013.01); *G01R 31/3624* (2013.01)
(58) Field of Classification Search
USPC ....................................................... 324/426
See application file for complete search history.

(56) References Cited

U.S. PATENT DOCUMENTS 6,265,848 B1 * 7/2001 Mukainakano ............... 320/132
6,483,274 B2 * 11/2002 Lee ............................... 320/132
(Continued)

FOREIGN PATENT DOCUMENTS

CN 101031810 A 9/2007
CN 101303397 A 11/2008
(Continued)

*Primary Examiner* — Yalkew Fantu
(74) *Attorney, Agent, or Firm* — Muncy, Geissler, Olds & Lowe, P.C.

(57) ABSTRACT

The invention relates to the technical field of lithium-ion batteries, in particular to a method for estimating the state of charge of a lithium-ion battery. The method includes: charging a lithium-ion battery, recording multiple groups of ampere-hour integral values, and states of charge and voltage values corresponding to the ampere-hour integral values; taking the maximum value in the multiple groups of ampere-hour integral values as the first ampere-hour integral value, the state of charge corresponding to the first ampere-hour integral value as the first state of charge, and the voltage value corresponding to the first ampere-hour integral value as the first voltage value; monitoring the lithium-ion battery in real time, recording a real-time second ampere-hour integral value and a second voltage value, obtaining a second state of charge by an ampere-hour measuring method; and if the second voltage value is consistent with the first voltage value and the second state of charge is inconsistent with the first state of charge, replacing the second state of charge with the first state of charge. The invention increases the reliable evidence for judging the online equalization of the battery pack and most importantly avoids the situation where the state of charge of the battery can be corrected only on condition that the battery pack works at the extreme state of charge, and lowers the influences of the full charge and discharge on the lifetime of the battery.

8 Claims, 4 Drawing Sheets

(56) References Cited

U.S. PATENT DOCUMENTS

| | | | |
|---|---|---|---|
| 6,534,954 B1 * | 3/2003 | Plett | 320/132 |
| 6,829,562 B2 * | 12/2004 | Sarfert | 702/182 |
| 2002/0168574 A1 * | 11/2002 | Ahn et al. | 429/232 |
| 2005/0046388 A1 * | 3/2005 | Tate et al. | 320/132 |
| 2009/0070052 A1 * | 3/2009 | Taniguchi et al. | 702/63 |

FOREIGN PATENT DOCUMENTS

| | | |
|---|---|---|
| FR | 2774514 A1 | 8/1999 |
| JP | 2003004826 A | 1/2003 |

* cited by examiner

METHOD FOR ESTIMATING STATE-OF-CHARGE OF LITHIUM ION BATTERY

1. TECHNICAL FIELD

The invention relates to the technical field of lithium-ion batteries, in particular to a method for estimating state of charge of a lithium-ion battery.

2. DESCRIPTION OF RELATED ART

The state of charge (SOC) of a battery is related to many factors (such as temperature, charge-discharge state at the previous time, polarization effect, lifetime of the battery, etc.) and is of high non-linearity, which makes the real-time online estimation of SOC very difficult. At present, methods for estimating the SOC of the battery mainly include: open circuit voltage method, ampere-hour measuring method, artificial neural network method, Kalman filtering method, etc.

The basic principle of the open circuit voltage method is as follows: a battery is left unused for at least one hour such that the voltage of the battery recovers to the open-circuit voltage. This method is not suitable for real-time online detection of the electric vehicle. FIG. 1 illustrates the relation curves of the open circuit voltage (OCV) and SOC of the iron phosphate lithium-ion ($LiFePo_4$) battery and the manganic acid lithium-ion battery. The OCV curve of the $LiFePo_4$ battery is relatively flat, so estimation of the SOC is relatively inoperative simply by the open circuit voltage method.

At present, the ampere-hour measuring method is usually adopted in the practical real-time online estimation of the SOC. However, this method has errors, and along with the increase of the service time, the accumulative errors become bigger and bigger, so desirable effects cannot be achieved simply by this method. Actually, the ampere-hour measuring method and the open circuit voltage method are usually combined in use, but the flat OCV-SOC curve of the $LiFePO_4$ battery does not count as a relevant feature of correction by ampere-hour measurement, so some people correct the SOC by means of the characteristic of large polarized voltage of the battery in the rear full charge-discharge stage. For the $LiFePO_4$ battery, the SOC of the battery is about above 90% when the polarized voltage increases considerably. It is known that the SOC of the battery corresponding to the charging current of the battery can be divided into three stages: first, an SOC low stage (for example SOC<10%), second, an SOC medium stage (for example 10%<SOC<90%), and third, an SOC high stage (for example SOC>90%). At the SOC low stage, the inner resistance of the battery is relatively large thus the battery is not suitable for large-current charge and discharge. At the SOC medium stage, the acceptable charging current of the battery increases, and the battery can be charged and discharged with a large current. At the SOC high stage, to prevent deposition and over-discharge of lithium, the acceptable charging and discharging current of the battery declines. Substantially speaking, to avoid negative influences of the battery working under the extreme conditions on the lifetime of the battery, the battery shall be controlled to not work at both SOC low stage and high stage. Therefore, it is suggested to avoid correcting the SOC by means of the characteristic of high polarized voltage when the battery works at the SOC low stage and high stage.

The data required by the artificial neural network method and Kalman filtering method is desirable mainly on the basis of the variation of the battery's voltage, both failing to meet the requirement of the $LiFePO_4$ battery on the SOC precision.

BRIEF SUMMARY OF THE INVENTION

The present invention provides a method for estimating the state of charge (SOC) of a lithium-on battery to solve the technical problem that the SOC precision of the lithium-on battery estimated using the flat OCV-SOC curve is low in the prior art.

To fulfill the above mentioned objective, the present invention adopts the following technical solution:

A method for estimating state of charge of a lithium-ion battery, including:

(11) Charging a lithium-ion battery, recording multiple groups of ampere-hour integral values, and states of charge and voltage values corresponding to the ampere-hour integral values;

(12) Taking the maximum value in the multiple groups of ampere-hour integral values in step (11) as the first ampere-hour integral value, the state of charge corresponding to the first ampere-hour integral value as the first state of charge, and the voltage value corresponding to the first ampere-hour integral value as the first voltage value;

Wherein, a series of data are recorded during monitoring, so the maximum value can be obtained by sorting the data; FIG. 2 depicts two peak values obtained on condition that the current charging rate is very small; the two peak values are close, but the maximum one still can be judged; when the current charging rate is the normal working multiplying power, the second peak value is quickly reduced because of the influence of the polarized voltage. The process of defining the maximum value as long as the value exceeds a certain threshold value is the existing judgment method. For example, two values may exceed the threshold value, and then one of the two is determined as the maximum value by comparison.

(13) Monitoring the lithium-ion battery in real time, recording a real-time second ampere-hour integral value, obtaining a second state of charge corresponding to the second ampere-hour integral value by an ampere-hour measuring method;

(14) And if the second state of charge is inconsistent with the first state of charge, replacing the second state of charge with the first state of charge as the one corresponding to the second ampere-hour integral value.

As a preferable solution, in step (12), the first maximum value in the multiple groups of ampere-hour integral values is taken as the first ampere-hour integral value.

As a preferable solution, step (14) specifically includes:

(31) If the second state of charge is inconsistent with the first state of charge and the difference counter does not exceed a preset first threshold value, then the difference counter adds 1, and then the step (13) is executed; and if the difference counter reaches or exceeds the preset first threshold value, the step (32) is executed;

(32) The first state of charge instead of the second state of charge is taken as the one corresponding to the second ampere-hour integral value.

As a further preferable solution, in step (31), if the difference between the second state of charge and the first state of charge exceeds a preset second threshold value and the difference counter does not exceed the preset first threshold value, then the difference counter adds 1, and the step (13) is executed; and if the difference counter reaches or exceeds the preset first threshold value, then the step (32) is executed.

As a further preferable solution, the second threshold value is 8%.

As a preferable solution, in step (12), the maximum value, corresponding to the state of charge, in the flat interval in the multiple groups of ampere-hour integral values in step (11) is taken as the first ampere-hour integral value.

As a further preferable solution, in the flat interval the SOC is less than 90% and more than 10%.

As a further preferable solution, in step (12), the first maximum value, corresponding to the state of charge, in the flat interval in the multiple groups of ampere-hour integral values in step (11) is taken as the first ampere-hour integral value.

As a further preferable solution, the lithium-ion battery may be an iron phosphate lithium-ion battery or manganic acid lithium-ion battery.

The present invention provides a method for reliably and acutely analyzing the SOC of a single cell corresponding to different charging rates and different aging degrees, prevail over the artificial neural network method and Kalman filtering method in data processing. SOC estimation of the battery by a ΔQ/ΔV curve provides more accurate judgment conditions for open circuit voltage-based equalization (SOC is equal to 50% of the first peak value), so the problem of online equalization of the battery pack can be solved and the influence of working under extreme conditions on the lifetime of the battery is reduced. Meanwhile, accurate and quick SOC estimation also provides a basis for the management control strategy of the future intelligent battery system.

The preset invention increases reliable evidence for judging the online equalization of the battery pack, most importantly avoids the situation that the state of charge of the battery can be corrected only on condition that the battery pack works at the extreme state of charge, and minimizes influences of full charge and discharge on the lifetime of the battery.

DETAILED DESCRIPTION OF THE INVENTION

The present invention is further described in detail with the reference of the attached drawings and the specific embodiments.

Among the electrochemical measuring methods, a linear potential sweep is usually adopted to control the electrode potential φ to vary at a constant speed, namely $$\frac{d\varphi}{dt}$$

is a constant, and meanwhile measure the current flowing through the electrode when the relation between the internal chemical reaction rate and the electrode potential of a battery is analyzed. This method is usually also called the volt-ampere method in electrochemistry. Linear sweep rate is significant for the shape and numerical value of the polarization curve of the electrode; when the battery undergoes electrochemical reactions during charging and discharging, the faster the sweep rate is, the larger the polarization voltage of the electrode is; only when the sweep rate is slow enough can a stable volt-ampere characteristic curve be obtained, and this curve mainly reflects the relation between the internal electrochemical reaction rate and the electrode potential of the battery. The volt-ampere curve reflects important features of the battery, but actually, it is hardly used for real-time measurement in real projection. This is because the battery fails to meet requirements of the linear potential sweep during charging and discharging such that the volt-ampere curve of the battery cannot be obtained directly.

Constant current-constant voltage (CC-CV) charge method is a common method for charging the battery. During a potential sweep, the potential always varies at a constant rate, and the electrochemical reaction rate varies with the potential, so the electric quantity Q of the charged and discharged current i of the battery in a certain period of time $(t_1-t_2)$ is as follows:

$$\Delta Q = \int_{t_1}^{t_2} i \times dt \quad (1)$$

Figure 1:
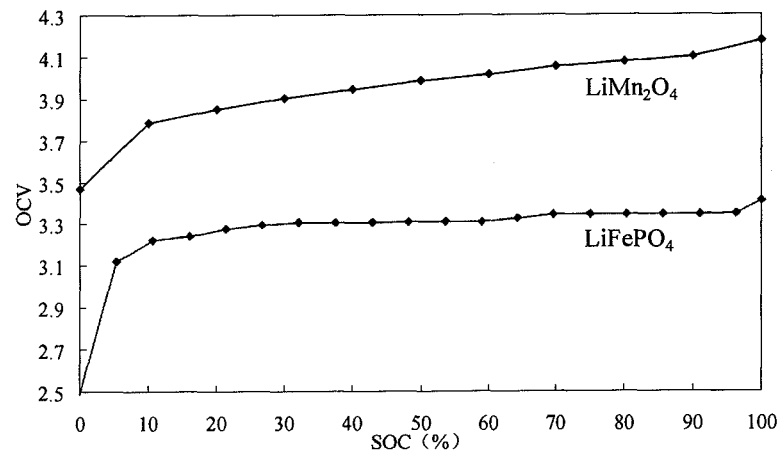
FIG. 1 illustrates OCV-SOC curves of an iron phosphate lithium-ion battery and a manganic acid lithium-ion battery.
Figure 2:
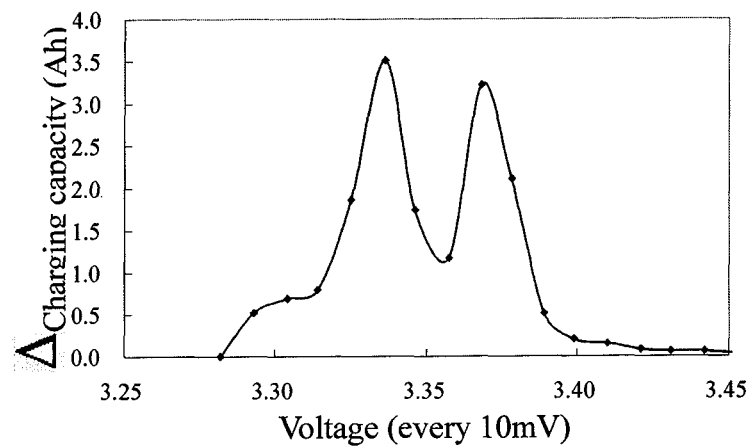
FIG. 2 illustrates a ΔQ/ΔV curve of the LiFePO$_4$ battery corresponding to a 1/20 C consistent charging current.

By measuring the voltage and current on line, enabling the voltage to vary constantly in the charge and discharge directions to obtain a group of voltages ΔV at an equal interval, and integrating the current at each time interval corresponding to each ΔV to obtain a group of ΔQ, the charging and discharging capacity of the battery can be reflected at different electrode potentials on the basis of the ΔQ/ΔV curve measured online. FIG. 2 illustrates a ΔQ/ΔV curve of the 20 Ah LiFePO$_4$ battery corresponding to a 1/20 C consistent charging current.

With the 1/20 C charging current, usually the polarized voltage of the battery is regarded to be very small, and some people hold the ideal that the charge curve under such current stress approaches the OCV curve of the battery. When the battery's voltage increases along with the charge process, the accumulated charged capacity is 3.5 Ah and 3.2 Ah respectively in two 10 mV time intervals corresponding to 3.34V and 3.37V. After exceeding two maximum values, the corresponding charged capacity starts to decline. The peak value is corresponding to a high electrochemical reaction rate. After reaching the peak value, the concentration and flow of the reactant play a leading role. Reduction of the reactant participating in the chemical reaction causes reduction of the charged capacity in corresponding voltage interval.

In this embodiment, the peak value ΔQ is used to correct SOC.

The lithium-ion battery is a complicated system. Viewed from the external features, the maximum allowable current (I) of charge and discharge has significant non-linearity relationship with the battery capacity (Q), the temperature (T), the SOC of the battery, the degree of aging of the batty (SOH) and the equalization (EQ) of the battery, as shown in the formula below:

$$I = f(Q, T, SOC, SOH, EQ) \quad (2)$$

From the internal electrochemical perspective, the charged and discharged capacity is respectively corresponding to the fusion and separation of the lithium-ion at the negative electrode. The rate change of the charged capacity corresponding to the voltage increase reflects that of the oxidation-reduction process of the battery system itself. The voltage platform of the $LiFePO_4$ battery is formed by the $FePO_4$—$LiFePO_4$ phase change of positive electrode and the fusion and separation of the lithium-ion at the negative electrode. Two oxidation and reduction peaks of the $LiFePO_4$ battery below are used to analyze the influences of the charging rate of the charging and discharging currents and the aging of battery on the SOC correction.

Figure 3:
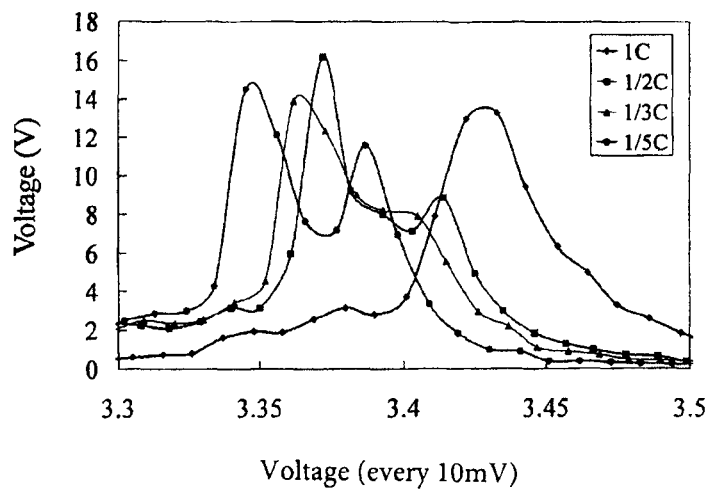
FIG. 3 illustrates voltage curves of the battery corresponding to different charging rates.

It is improper to measure the battery performance by the size of the charging current because the charging current of the battery with large capacity increases. FIG. 3 illustrates the charging curves of a 20 Ah single cell corresponding to the charging rates of 1 C, ½ C, ⅓ C and ⅕ C.

The voltages capable of being measured online are two outer voltages ($U_O$) on two terminals of the battery. The outer voltage of the battery is equal to the sum of the open circuit voltage (OCV), the ohm voltage drop ($U_R$) and the polarized voltage ($U_P$) of the battery. Difficult charging rate causes different ohm voltage drop ($U_R$), and the capacity of the battery receiving the current stress also leads to different polarized voltage ($U_P$). With SOC to be corrected, it is impractical to depend on the voltage curve of the battery.

When the charging and discharging current is 0 and after standing for enough long time, the $U_R$ and $U_P$ of the battery are both 0, and then the OCV is equal to the terminal voltage $U_O$ of the battery. However, the SOC of the $LiFePO_4$ battery cannot be acutely corrected according to the OCV-SOC curve.

Figure 4:
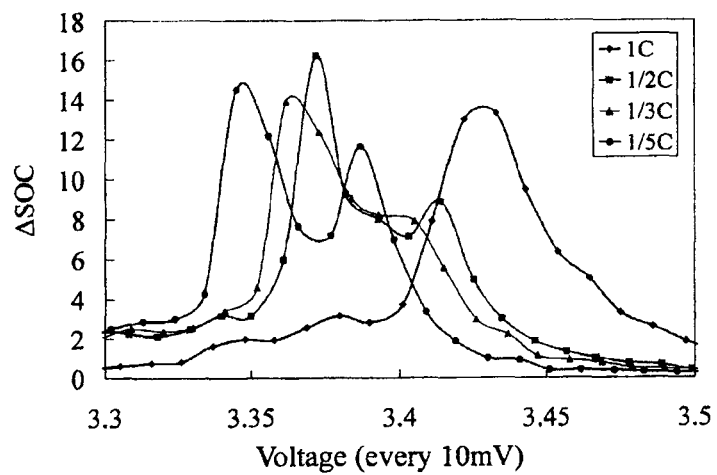
FIG. 4 illustrates ΔSOC/ΔV curves of the battery corresponding to different charging rates.

FIG. 4 depicts the $\Delta SOC/\Delta V$ curves corresponding to different charging rates. To more visually reflect the change rate of the charged capacity, the longitudinal axis is represented by SOC of the battery, wherein $\Delta Q/Q = \Delta SOC$.

The peak curve of SOC corresponding to four charging rates respectively has its own density and peak position along with the change of the voltage. The following results can be obtained in FIG. 4: (1) two obvious drop peaks appear by the charging rates of ½ C, ⅓ C and ⅕ C, similar to the characteristic curve as shown in FIG. 2; (2) the voltage values corresponding to the peak positions by charging rates of 1 C, ½ C, ⅓ C and ⅕ C increase in term; and (3) the capacity of the battery is mainly charged at the positions nearby the two peak values, and the voltages corresponding to the peak values are located on the voltage platform of the battery.

The ohm voltage drop and polarized voltage of the battery are mainly influenced by the current charging rate. Without considering the accumulation of the polarized voltage, in case of identical SOC, the bigger the current charging rate is, the bigger the $U_R$ and $U_P$ are. When the horizontal ordinate in FIG. 4 is changed into the SOC value of the battery, FIG. 5 is obtained.

Figure 5:
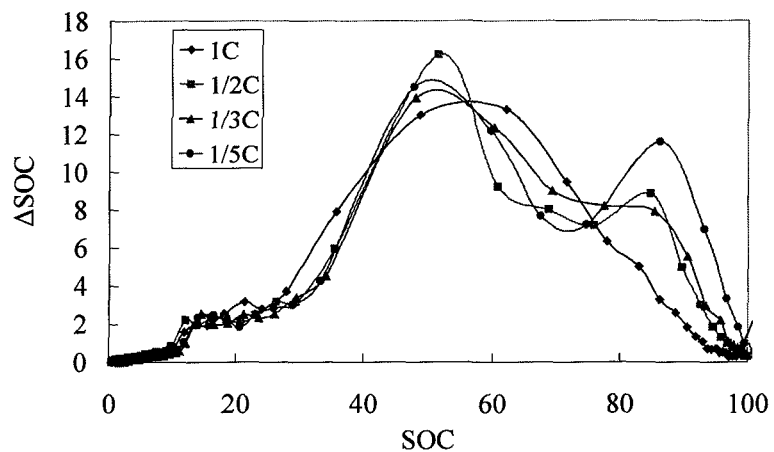
FIG. 5 illustrates ΔSOC/SOC curves of the battery corresponding to different charging rates.

Data shown in FIG. 5 is still selected at a 10 mV voltage interval, and then the SOC is obtained by acutely calibrated ampere-hour integral. It is clear that the SOC points corresponding to the peak values by the charging rates of ½ C, ⅓ C and ⅕ C are 50% and 85% respectively. As shown in FIG. 3, the ohm voltage drop and polarized voltage of the battery by the charging rate of 1 C are relatively large, meanwhile, the internal resistance of the battery varies little with the SOC change in the constant-current charging process, which means the $U_R$ varies little, so the major cause that the second peak value by the charging rate of 1 C in FIG. 4 and FIG. 5 is the change of the polarized voltage. In such circumstances, it is difficult to observe high charged capacity under the condition of identical voltage change rate. Besides, the charging rate of the common energy battery is below 1 C, so the features of the battery corresponding to a normal charging rate are primarily analyzed.

Figure 6:
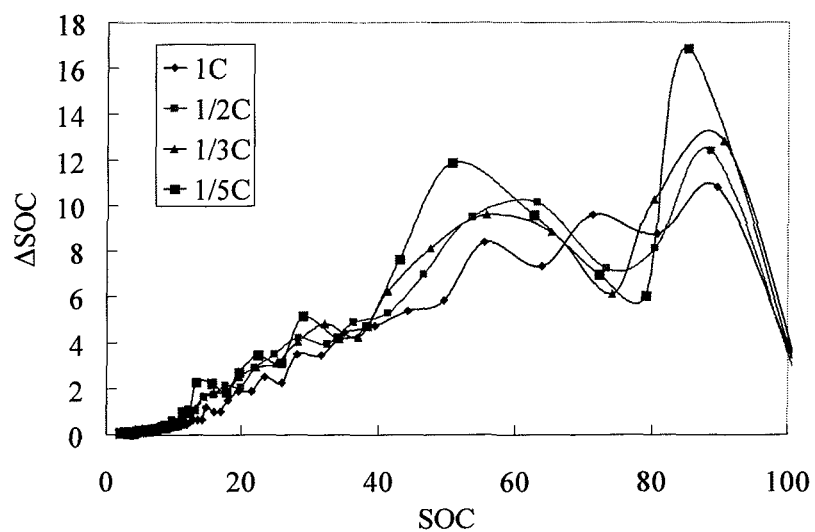
FIG. 6 illustrates ΔSOC/SOC curves of the battery corresponding to different discharging rates.

$\Delta SOC/SOC$ curves of the battery corresponding to different discharging rates can be seen in FIG. 6. It is clear that the SOC points corresponding to the peak values by the discharging rates of ½ C, ⅓ C and ⅕ C are 80% and 55% respectively. However, the discharge current is very unstable in actual use and the case is relatively complicated, which leads to stubborn existence of the change of the $U_R$ and $U_P$ and cause a relatively large error to the $\Delta V$ value obtained. Thus, the accuracy of SOC correction of the peak values of the $\Delta Q/\Delta V$ curve is influenced.

If the battery management system is used for measuring the battery voltage obtained in the charging process on line, without the influences of the inner resistance and the polarization, the obtained $\Delta Q/\Delta V$ curve shall be identical with that in FIG. 2, which means that the SOC values corresponding to the peak values of the $\Delta Q/\Delta V$ curves by different charging rates can be used as the conditions for correcting the SOC of the battery accurately. Especially on the condition that the voltage platform of the $LiFePO_4$ battery is very flat, the amplitude of the peak values is more conspicuous.

The aging of the battery is mainly caused by reduction of the capacity and increase of the inner resistance. The causes of the reduction of the capacity and increase of the inner resistance of the lithium-ion battery have been studied at home and abroad, wherein for reduction of the capacity, it is usually regarded that inevitable chemical reaction generated in the charge and discharge processes leads to loss of lithium ions participating in the reaction; and for the increase of the inner resistance of the battery, the passivation of the internal structure of the battery is usually regarded as the cause, such as the thickening of the SEI film and the change of the structures of the positive and negative electrodes.

When the battery is aged, the application ranges of the open voltage method and the ampere-hour integral method are not changed, but the neural network method and the Kalman filtering method are greatly influenced because the parameters of the established battery module are changed along with the aging, especially the difference in aging tracks caused by inconsistency of the batteries applied in groups reduces the applicability of the model, for example: the neural network requires training again, while the parameters of the model based on the Kalman algorithm require changing. SOC correction after battery aging is significant for perfecting management of the BMS and prolonging the lifetime of the battery pack.

Figure 7:
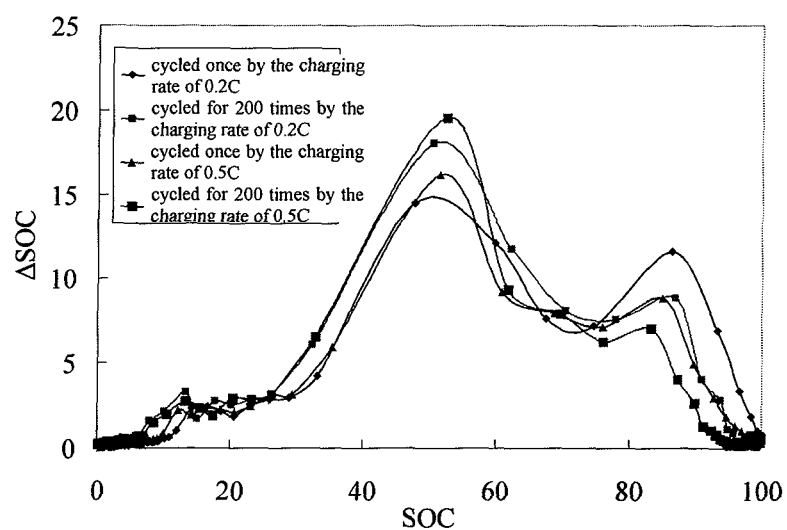
FIG. 7 illustrates difference of ΔSOC/SOC curves before and after aging.

The $\Delta Q/\Delta V$ curve reflects the internal electromechanical features of the battery, so for the electric vehicles, it is regulated that the lifetime of the battery is terminated if the battery capacity is lower than 80% of the rated capacity. At this moment, the chemical reaction in the battery depends on the concentration of the reactant and the internal structure of the battery system. FIG. 7 depicts the $\Delta SOC/SOC$ features of the $LiFePO_4$ battery in the working area with 100% DOD after recycling for 200 times, wherein the capacity is reduced to 95% of the rated capacity.

After 200 cycles, the capacity keeping ability of the tested battery is lowered; the internal structure is changed; and the increase of the capacity is concentrated at a position with an SOC value corresponding to the first peak value. Compared with a new battery, it is found that the charged capacity corresponding to the second peak is obviously reduced, which reflects decline of the lithium-ion fusion ability of the graphite negative electrode and the current receiving ability of the battery, the increase of the polarized voltage and the reduction of the lifetime.

The BMS system collects the voltage and current of the single cell in real time, and the inner resistance of the battery is calculated by analyzing the voltage change of the step current signal. Eliminating the influence of the ohm voltage drop UR is good for obtaining the voltage change value $\Delta V$ of the varying current in the optimized charging process (constant current charge has no influence), and then the ampere-hour integral value $\Delta Q$ in the corresponding interval at an equal interval (such as 10 mV) can be obtained. Mathematically, to judge the extreme values of the $\Delta Q/\Delta V$ curve, the first-order derivative of the function of the curve shall be calculated. In actual use, the voltages at positions of the two maximum values both have a certain range. The battery is charged from a lower SOC point; a group of $\Delta Q$ values are recorded in the charging process; and then two maximum values meeting requirements can be obtained after simple data processing. (particularly, only one maximum value exists by the charging rate of extremely approaching 1 C). The position of the first peak value shall be judged and recorded according to the voltage value when the peak point appears; when the recorded peak points are identical in two or more charging processes and the difference between the recorded peak points and the SOC value recorded by the BMS is above 8% (usually the electric vehicle requires that the SOC precision shall be about 8%), the operation of correcting SOC of the battery shall be executed, and the correction event shall be recorded for debugging and analysis.

This embodiment adopts the following technical solution:

(S1) charge a lithium-ion battery, record multiple groups of ampere-hour integral values, and states of charge and voltage values corresponding to the ampere-hour integral values;

(S2) take the first maximum value in the multiple groups of ampere-hour integral values in step (S1) as the first ampere-hour integral value, the state of charge corresponding to the first ampere-hour integral value as the first state of charge, and the voltage value corresponding to the first ampere-hour integral value as the first voltage value;

Preferably, the first maximum value of the SOC in the range of [10, 90] is taken as the first ampere-hour integral value because the lifetime of the lithium-ion battery is greatly reduced when the SOC of the lithium-ion battery is smaller than 10 or more than 90 for a long time.

(S3) monitor the lithium-ion battery in real time, record a real-time ampere-hour integral value as a second ampere-hour integral value and a second voltage value corresponding to the second ampere-hour integral value, obtain a second SOC corresponding to the second ampere-hour integral value by the ampere-hour measuring method;

(S4) if the difference between the second SOC and the first SOC exceeds a preset second threshold value and the difference counter does not exceed the preset first threshold value, add 1 to the difference counter and then execute the step (13); and if the difference counter reaches or exceeds the preset first threshold value, replace the second SOC with the first SOC as the one corresponding to the second ampere-hour integral value.

Preferably, when the difference between the second SOC and the first SOC exceeds 8% for over 3 times, replace the second SOC with the first SOC as the one corresponding to the second ampere-hour integral value.

Usually, the lithium manganese oxide type, lithium iron phosphate type, lithium titanate and ternary battery type lithium-ion batteries all have maximum values of $\Delta Q$. This is determined by the electrochemical characteristics of the battery. Usually, those skilled in the battery engineering field have not used this method for SOC correction.

The above description is only a preferable embodiment of the present invention. It should be noted that: for those skilled in this field, more modifications and improvements can be made on the premise of the technical principle of the present invention, which all shall be incorporated within the protective scope of the present invention.

What is claimed is:

1. A method for estimating a state of charge of a lithium-ion battery, comprising: (11) charging a lithium-ion battery, recording multiple groups of ampere-hour integral values, and states of charge and voltage values corresponding to the ampere-hour integral values; (12) taking the maximum value in the multiple groups of ampere-hour integral values in step (11) as the first ampere-hour integral value, the state of charge corresponding to the first ampere-hour integral value as the first state of charge, and the voltage value corresponding to the first ampere-hour integral value as the first voltage value; (13) monitoring the lithium-ion battery in real time, recording a real-time second ampere-hour integral value, obtaining a second state of charge corresponding to the second ampere-hour integral value by an ampere-hour measuring method; (14) if the second state of charge is inconsistent with the first state of charge, replacing the second state of charge with the first state of charge as the one corresponding to the second ampere-hour integral value; and characterized in that step (14) comprises the following steps (31) if the second state of charge is inconsistent with the first state of charge and the difference counter does not exceed a preset first threshold value, then the difference counter adds 1, and then the step (13) is repeatedly executed; and if the difference counter reaches or exceeds the preset first threshold value, the step (32) is executed; (32) the first state of charge instead of the second state of charge is taken as the one corresponding to the second ampere-hour integral value.

2. The method according to claim 1, characterized in that, in step (12), the maximum value in the multiple groups of ampere-hour integral values is taken as the first ampere-hour integral value.

3. The method according to claim 1, characterized in that, in step (31), if the difference between the second state of charge and the first state of charge exceeds a preset second threshold value and the difference counter does not exceed the preset first threshold value, then the difference counter adds 1, and the step (13) is repeatedly executed; and if the difference counter reaches or exceeds the preset first threshold value, then the step (32) is executed.

4. The method according to claim 3, characterized in that the second threshold value is 8%.

5. The method according to claim 1, characterized in that, in step (12), the maximum value, corresponding to the state of charge, in the flat interval in the multiple groups of ampere-hour integral values in step (11) is taken as the first ampere-hour integral value.

6. The method according to claim 5, characterized in that in the flat interval the state of charge is less than 90% and more than 10%.

7. The method according to claim 5, characterized in that, in step (12), the first maximum value, corresponding to the state of charge, in the flat interval in the multiple groups of ampere-hour integral values in step (11) is taken as the first ampere-hour integral value.

8. The method according to claim 1, characterized in that the lithium-ion battery may be an iron phosphate lithium-ion battery or manganic acid lithium-ion battery.

* * * * *